(12) United States Patent
Sasaki et al.

(10) Patent No.: US 11,340,638 B2
(45) Date of Patent: *May 24, 2022

(54) ELECTRONIC COMPONENT HANDLING DEVICE AND ELECTRONIC COMPONENT TESTING APPARATUS

(71) Applicant: ADVANTEST Corporation, Tokyo (JP)

(72) Inventors: Hirotaka Sasaki, Tokyo (JP); Hideki Ichikawa, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 186 days.

This patent is subject to a terminal disclaimer.

(21) Appl. No.: 16/575,460

(22) Filed: Sep. 19, 2019

(65) Prior Publication Data
US 2020/0241582 A1    Jul. 30, 2020

(30) Foreign Application Priority Data

Jan. 30, 2019  (JP) .............................. JP2019-014535

(51) Int. Cl.
*G05D 23/19*     (2006.01)
*G01R 1/04*      (2006.01)

(52) U.S. Cl.
CPC ....... *G05D 23/1917* (2013.01); *G01R 1/0458* (2013.01); *G05D 23/1951* (2013.01)

(58) Field of Classification Search
CPC .................. G05D 23/1951; G05D 23/1917
USPC ...................................................... 700/121
See application file for complete search history.

(56) References Cited

U.S. PATENT DOCUMENTS 5,205,132 A * 4/1993 Fu ...................... G01R 31/2891
                                                            236/15 BB
6,545,494 B1   4/2003 Olsen et al.
(Continued)

FOREIGN PATENT DOCUMENTS

CN    1526076 A    9/2004
CN    1720460 A    1/2006
(Continued)

OTHER PUBLICATIONS

Office Action issued in the counterpart Taiwanese Patent Application No. 108130596, dated Dec. 25, 2020 (4 pages), English translation provided Sep. 21, 2021.
(Continued)

*Primary Examiner* — Hien D Khuu
(74) *Attorney, Agent, or Firm* — Osha Bergman Watanabe & Burton LLP

(57) ABSTRACT

An electronic component handling apparatus for handling a DUT and pressing the DUT against a socket electrically connected to a tester, including: a temperature adjuster adjusting a temperature of the DUT; a first calculator calculating the temperature of the DUT on the basis of a detection result of a temperature detection circuit disposed in the DUT; a temperature controller controlling the temperature adjuster; and a first controller outputting a first signal to the temperature controller. A temperature control includes a first temperature control based on the temperature of the DUT calculated by the first calculator and a second temperature control, and when the first signal is input from the first controller to the temperature controller after the temperature controller starts the first temperature control, the temperature controller switches the temperature control from the first temperature control to the second temperature control.

4 Claims, 4 Drawing Sheets

(56) References Cited

U.S. PATENT DOCUMENTS

| | | | | |
|---|---|---|---|---|
| 2002/0050834 A1* | 5/2002 | Olsen | ................ | G05D 23/1934 |
| | | | | 324/750.06 |
| 2008/0164899 A1* | 7/2008 | Ando | ................ | G01R 31/2874 |
| | | | | 324/750.13 |
| 2008/0238466 A1* | 10/2008 | Lopez | ................ | G01R 1/0458 |
| | | | | 324/750.28 |
| 2013/0113509 A1* | 5/2013 | Wu | ................ | G01R 31/2874 |
| | | | | 324/750.03 |
| 2018/0136276 A1 | 5/2018 | Shimizu et al. | | |
| 2019/0101587 A1* | 4/2019 | Watanabe | ........ | G01R 31/2884 |
| 2019/0162777 A1* | 5/2019 | Chiang | ............ | G01R 31/2875 |

FOREIGN PATENT DOCUMENTS

| | | | |
|---|---|---|---|
| CN | 1853111 | A | 10/2006 |
| CN | 101286043 | A | 10/2008 |
| CN | 101344570 | A | 1/2009 |
| CN | 101512357 | A | 8/2009 |
| CN | 101617241 | A | 12/2009 |
| CN | 1853111 | * | 4/2010 |
| CN | 102007329 | A | 4/2011 |
| CN | 104114996 | A | 10/2014 |
| CN | 106909186 | A | 6/2017 |
| JP | 2004-503924 | A | 2/2004 |
| TW | 201818053 | A | 5/2018 |
| WO | 2006123404 | A1 | 11/2006 |
| WO | 2017210108 | A1 | 12/2017 |

OTHER PUBLICATIONS

Office Action issued in counterpart Chinese Patent Application No. CN 201910665959 X dated Jul. 6, 2021 (20 pages).

Office Action issued in corresponding Chinese Patent Application No. 201910665959.X, dated Jan. 4, 2022 (29 pages).

* cited by examiner

ELECTRONIC COMPONENT HANDLING DEVICE AND ELECTRONIC COMPONENT TESTING APPARATUS

TECHNICAL FIELD

The present invention relates to an electronic component handling apparatus used for testing an electronic component under test (hereinafter, simply referred to as a "device under test (DUT)") such as a semiconductor integrated circuit device and an electronic component testing apparatus including the same.

The present application claims priority from Japanese Patent Application No. 2019-14535 filed on Jan. 30, 2019. The contents described and/or illustrated in the documents relevant to the Japanese Patent Application No. 2019-14535 will be incorporated herein by reference as a part of the description and/or drawings of the present application.

BACKGROUND ART

There is known an apparatus in which a DUT is attached to a socket provided in a test circuit board, a tester acquires the signal of a temperature sensing diode integrally formed on a chip die of the DUT via a connector of the circuit board, and the tester supplies the signal indicating a DUT temperature to a temperature controller (for example, see Patent Document 1). This temperature controller controls cooling means and heating means so that the DUT temperature is kept at a desired set value by using a signal indicating the DUT temperature.

CITATION LIST

Patent Document

Patent Document 1: JP 2004-503924 W

SUMMARY OF THE INVENTION

Problem to be Solved by the Invention

However, in the case of a DUT that rapidly self-heats in a short time, there is a problem in which the DUT temperature largely deviates from a desired setting value due to a rapid temperature change of the DUT in the temperature control based on the signal indicating the DUT temperature in real time.

An object of the invention is to provide an electronic component handling apparatus and an electronic component testing apparatus capable of controlling a DUT temperature within an appropriate range even in a DUT in which a rapid temperature change is generated under test.

Means for Solving Problem

[1] An electronic component handling apparatus according to the invention is an electronic component handling apparatus for handling a DUT having a temperature detection circuit and pressing the DUT against a socket electrically connected to a tester testing the DUT, including: a temperature adjuster adjusting a temperature of the DUT; a first calculator calculating the temperature of the DUT on the basis of a detection result of the temperature detection circuit; a temperature controller controlling the temperature adjuster; and a first controller outputting a first signal to the temperature controller, in which a temperature control performed by the temperature controller includes a first temperature control based on the temperature of the DUT calculated by the first calculator and a second temperature control different from the first temperature control, and in which when the first signal is input from the first controller to the temperature controller after the temperature controller starts the first temperature control, the temperature controller switches the temperature control of the DUT from the first temperature control to the second temperature control.

[2] In the above invention, the second temperature control may include controlling the temperature adjuster so that cooling or heating of the DUT is forcedly started on the basis of the first signal.

[3] In the above invention, the first signal may be input to the temperature controller after a first predetermined time is elapsed from the start of the first temperature control, the first predetermined time may be set on the basis of a previously measured temperature profile, and the temperature profile may be a profile indicating a behavior of the temperature of the DUT tested by the tester while the temperature is adjusted by the first temperature control.

[4] In the above invention, the first predetermined time may be set on the basis of an elapsed time from the start of the test to a temperature peak in the temperature profile and a heating value at the temperature peak.

[5] In the above invention, the first predetermined time may be set on the basis of temperature control response characteristics of the temperature adjuster and temperature control response characteristics of the DUT in addition to the temperature profile.

[6] In the above invention, the temperature controller may return the temperature control of the DUT from the second temperature control to the first temperature control when the second temperature control is completed.

[7] In the above invention, the second temperature control may include controlling the temperature adjuster so that cooling or heating of the DUT is forcedly started on the basis of the first signal and the cooling or heating of the DUT is stopped after a second predetermined time is elapsed from the start of the second temperature control and then the heating or cooling of the DUT is started.

[8] In the above invention, the first controller may output a start signal to the temperature controller and the temperature controller may start the first temperature control when the start signal is input from the first controller.

[9] In the above invention, the electronic component handling device may further include: a first receiver receiving a second signal indicating a junction temperature of the DUT output from the tester; and a second receiver receiving a third signal indicating a detection value of the temperature detection circuit output from the tester, in which the first calculator calculates the temperature of the DUT by using the second signal and the third signal.

[10] An electronic component testing apparatus according to the invention is an electronic component testing apparatus including: the electronic component handling device; and the tester electrically connected to a socket and testing the DUT, in which the tester includes a second calculator calculating a junction temperature of the DUT from a detection value of the temperature detection circuit, a first transmitter transmitting a calculation result of the second calculator as a second signal, and a second transmitter transmitting the detection value of the temperature detection circuit as a third signal.

Effect of the Invention

In the invention, since the DUT temperature is controlled by the first temperature control based on the DUT temperature calculated by the first calculator and the second temperature control different from the first temperature control, the DUT temperature can be controlled within an appropriate range even in the DUT that rapidly self-heats.

MODE(S) FOR CARRYING OUT THE INVENTION

Hereinafter, embodiments of the invention will be described with reference to the drawings.

Figure 1:
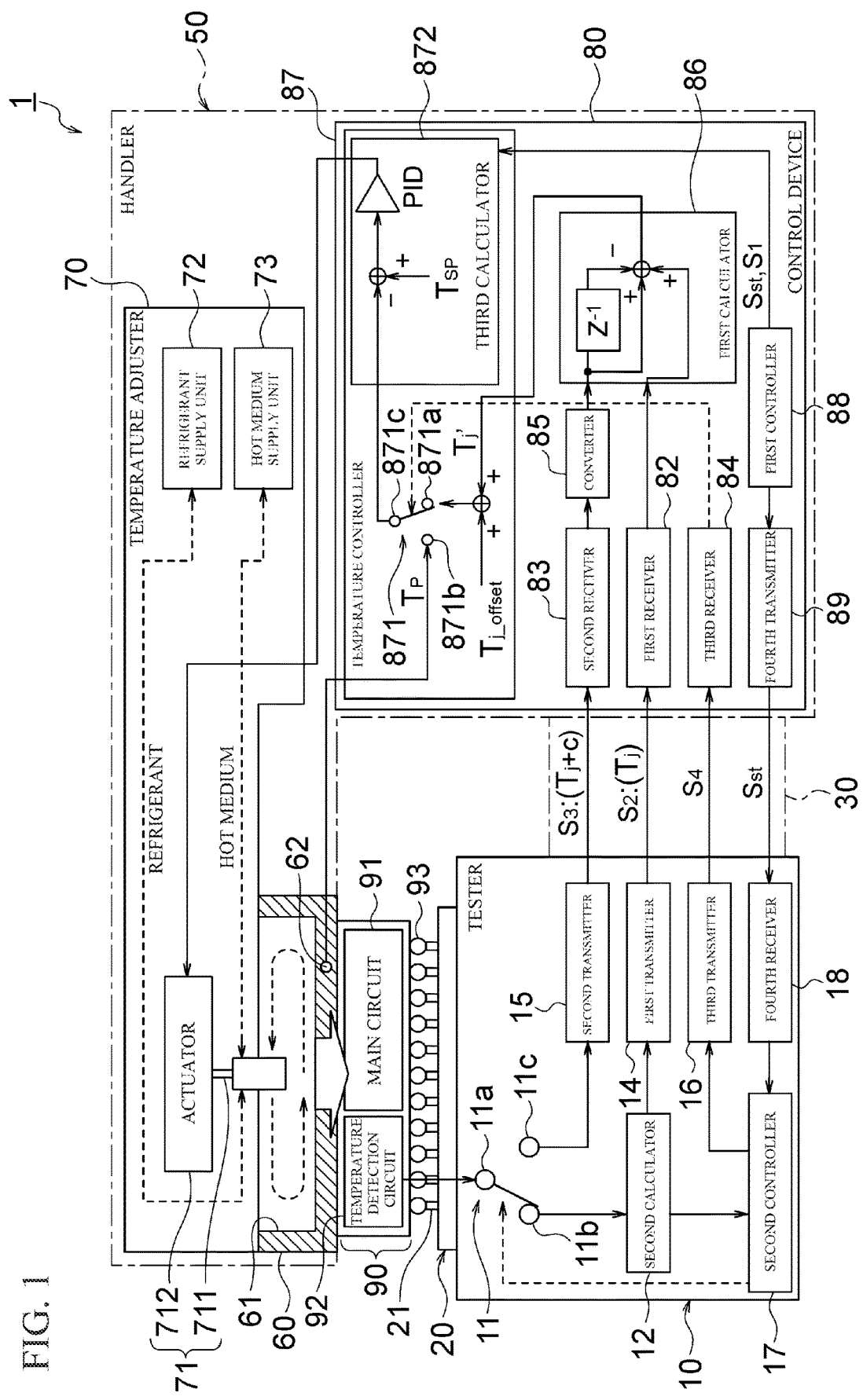
FIG. 1 is a block diagram illustrating a configuration of an electronic component testing apparatus in an embodiment of the invention.
Figure 2:
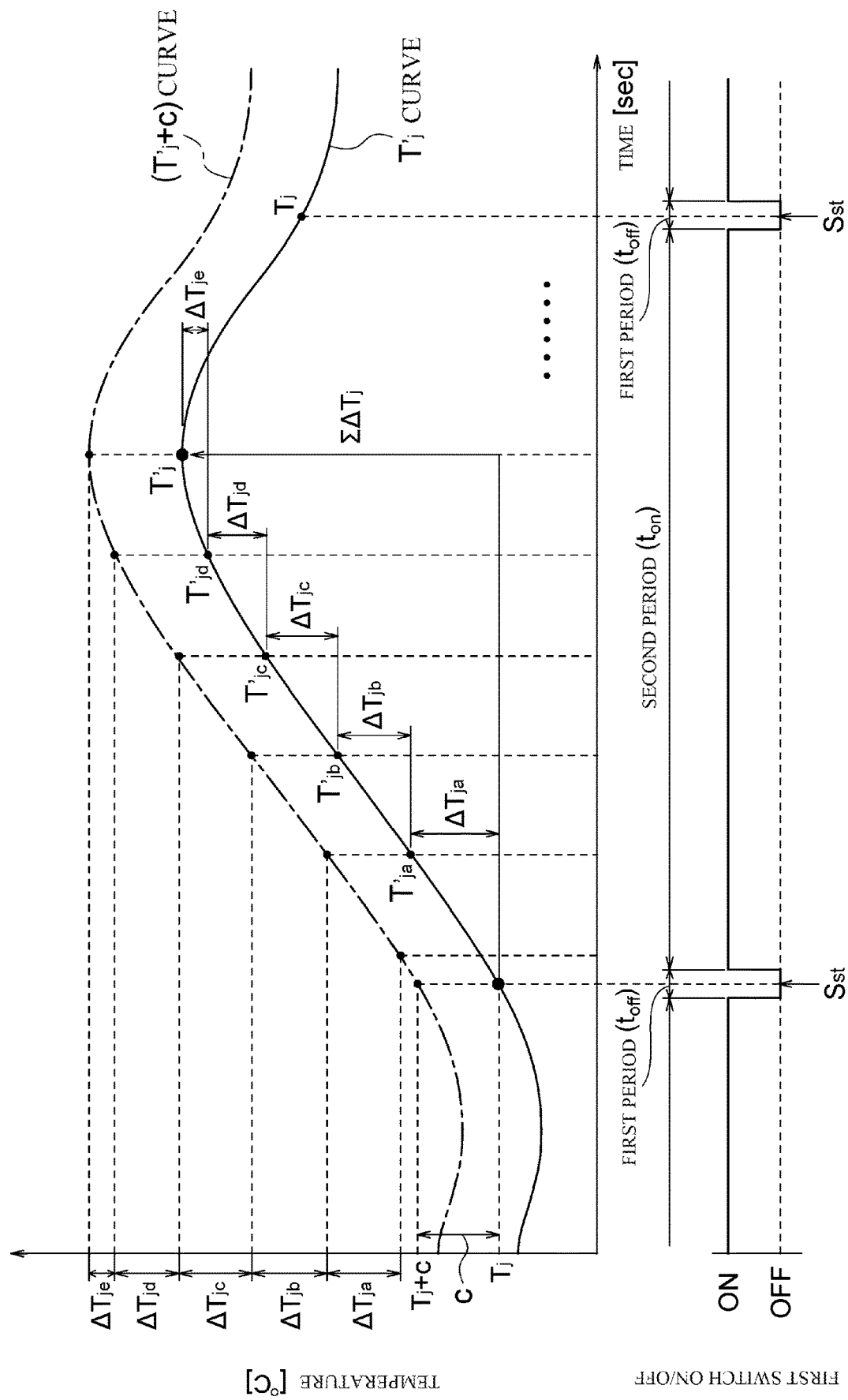
FIG. 2 is a diagram illustrating a method of calculating a DUT temperature $T_j'$ in the embodiment of the invention.
Figure 3:
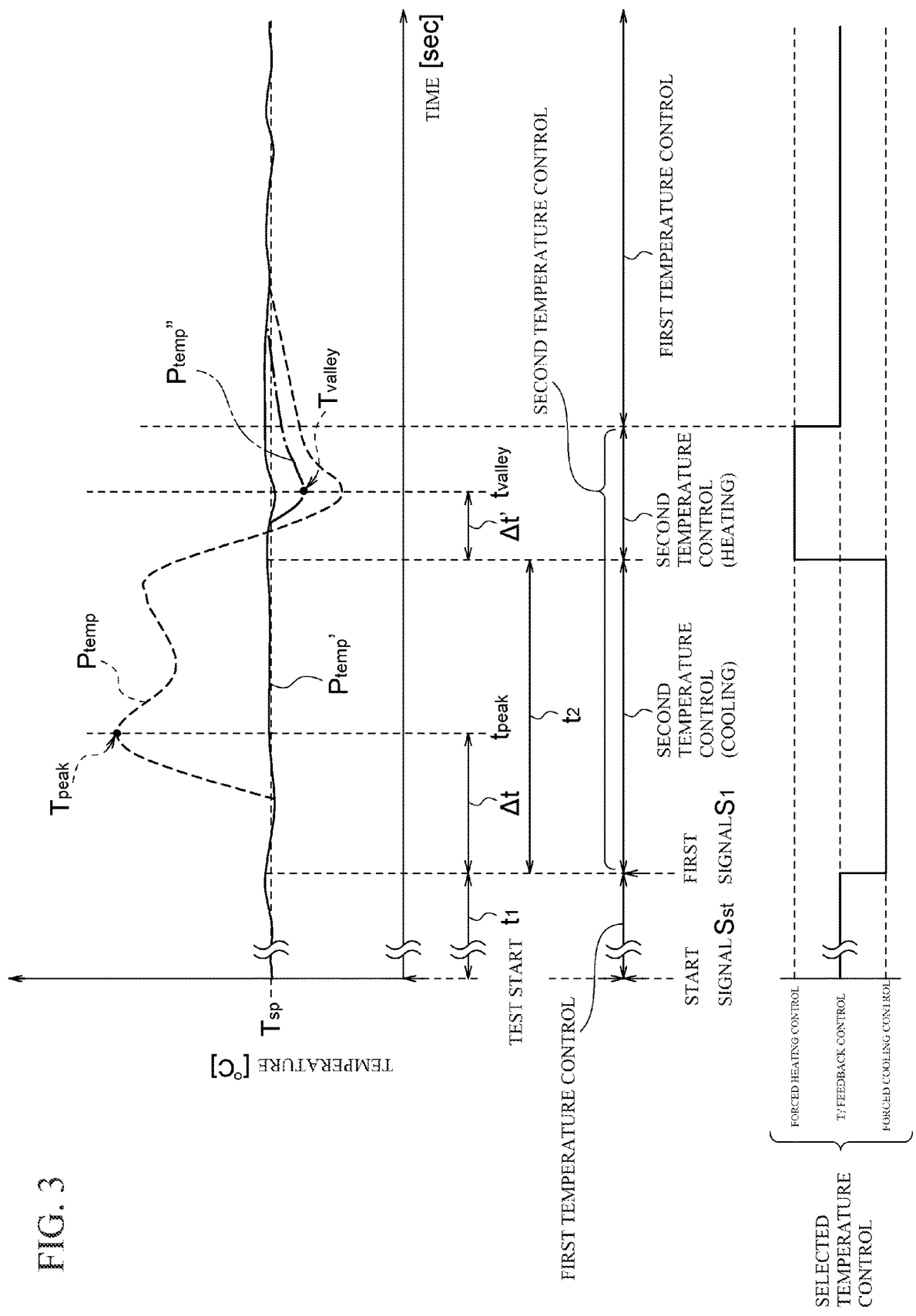
FIG. 3 is a diagram illustrating a first temperature control and a second temperature control in the embodiment of the invention.
Figure 4:
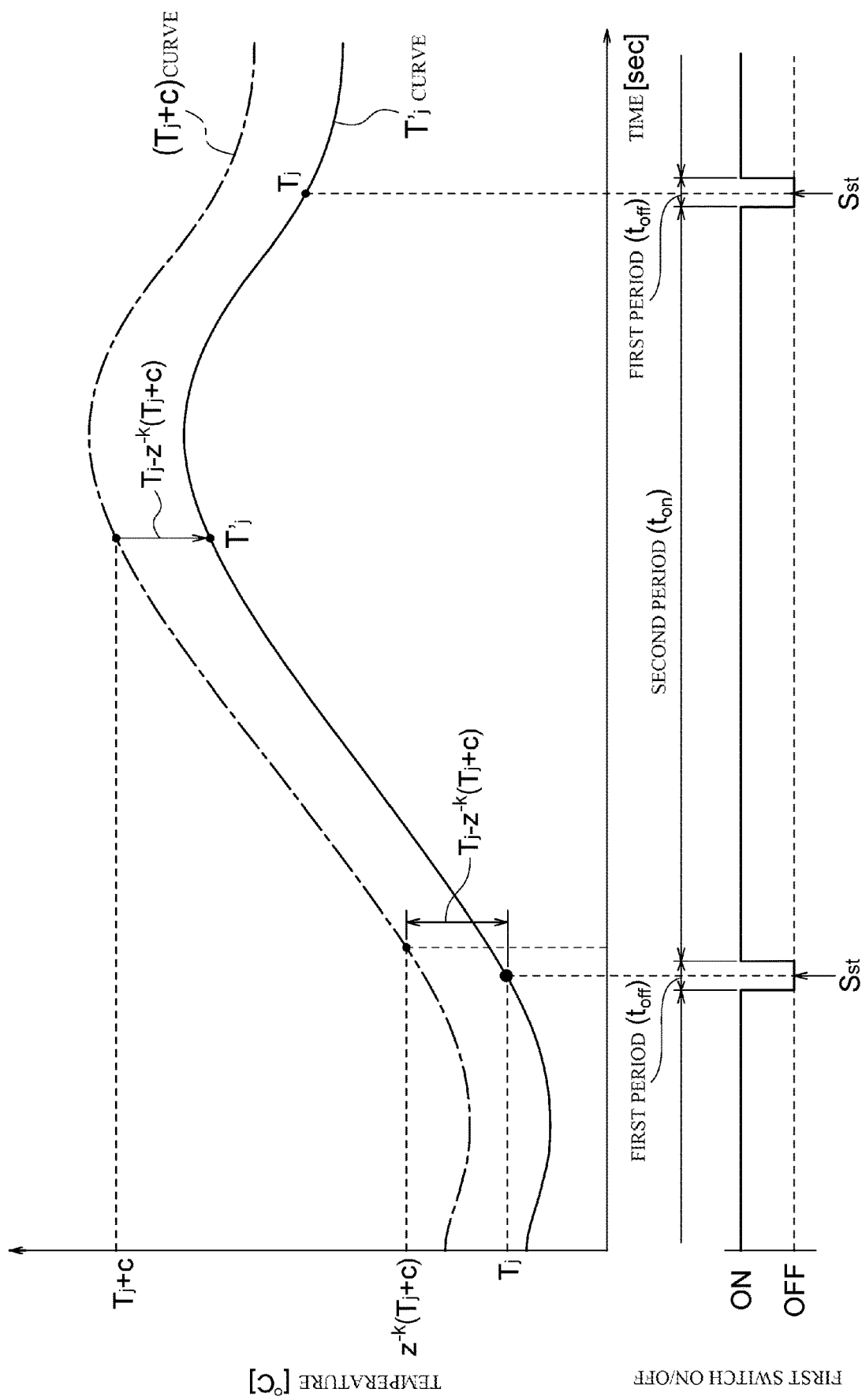
FIG. 4 is a diagram illustrating a modified example of a method of calculating the DUT temperature $T_j'$ in the embodiment of the invention.

FIG. 1 is a block diagram illustrating a configuration of an electronic component testing apparatus of the embodiment, FIG. 2 is a diagram illustrating a method of calculating a DUT temperature $T_j'$ of the embodiment, FIG. 3 is a diagram illustrating a first temperature control and a second temperature control of the embodiment, and FIG. 4 is a diagram illustrating a modified example of a method of calculating the DUT temperature $T_j'$ of the embodiment.

An electronic component testing apparatus 1 of the embodiment is an apparatus for testing electrical characteristics of a DUT 90 such as a semiconductor integrated circuit device. As illustrated in FIG. 1, the DUT 90 of the embodiment includes a temperature detection circuit 92 for detecting a temperature of the DUT 90 in addition to a main circuit 91 to be tested by a tester 10.

The temperature detection circuit 92 of the embodiment is, for example, a circuit including a thermal diode, and is formed on a semiconductor substrate on which the main circuit 91 is formed. The temperature detection circuit 92 detects the temperature of the DUT 90 by utilizing the temperature dependency of a PN junction. The configuration of the temperature detection circuit 92 is not particularly limited to the above-described configuration. For example, the temperature detection circuit 92 may be configured using an element having temperature-dependent resistance characteristics or band gap characteristics. Alternatively, as the temperature detection circuit 92, a thermocouple may be buried in the DUT 90.

As illustrated in FIG. 1, the electronic component testing apparatus 1 of the embodiment includes a tester 10 and an electronic component handling device 50 (hereinafter, simply referred to as a handler 50).

A socket 20 is mounted on the tester 10. When the DUT 90 is pressed against the socket 20 by the handler 50, the DUT 90 is electrically connected to the tester 10 via the socket 20. Then, the tester 10 performs the test of the DUT 90 by inputting and outputting a test signal to and from the main circuit 91 of the DUT 90 via the socket 20. Further, a detection voltage signal of the temperature detection circuit 92 of the DUT 90 is transmitted to the tester 10 via the socket 20.

The handler 50 is an apparatus that handles the DUT 90 and is configured to supply the DUT 90 before test to the socket 20 so that the DUT 90 is pressed against the socket 20. The handler 50 is configured to sort the DUT 90 after test in response to the test result. The tester 10 and the handler 50 are connected to each other via a cable 30 so that a signal can be transmitted and received between the tester 10 and the handler 50. Additionally, the tester 10 and the handler 50 may transmit and receive the signal by using an optical radio communication using an infrared ray or the like. In this case, the cable 30 may be omitted.

Further, the socket 20 is mounted on the tester 10. The socket 20 includes contacts 21 which are disposed so as to correspond to input/output terminals 93 of the DUT 90. When the DUT 90 is pressed against the socket 20 by the handler 50, the input/output terminal 93 of the DUT 90 contacts the contact 21 of the socket 20 so that the DUT 90 is electrically connected to the socket 20.

As illustrated in FIG. 1, the tester 10 includes a first switch 11, a second calculator 12, a first transmitter 14, a second transmitter 15, a third transmitter 16, a second controller 17, and a fourth receiver 18.

An input terminal 11a of the first switch 11 is electrically connected to the socket 20. Further, one output terminal 11b of the first switch 11 is electrically connected to the second calculator 12. Meanwhile, the other output terminal 11c of the first switch 11 is electrically connected to the second transmitter 15. The first switch 11 is configured to selectively switch the output destination to the second calculator 12 and the second transmitter 15 in accordance with the control signal from the second controller 17 of the tester 10. As an example of the second controller 17, a workstation can be exemplified. The detection voltage signal of the temperature detection circuit 92 is input to each of the second calculator 12 and the second transmitter 15 via the socket 20 and the first switch 11. The detection voltage signal of the temperature detection circuit 92 is an analog signal.

The second calculator 12 has an AD converting function of converting the detection voltage signal of the temperature detection circuit 92 into a digital signal and a calculation function of obtaining a junction temperature $T_j$ by performing a predetermined correction process on the detection voltage signal. The second calculator 12 generates a second signal $S_2$ indicating the junction temperature $T_j$ and outputs the second signal $S_2$ to the second controller 17 and the first transmitter 14. The junction temperature T is a temperature of a semiconductor substrate within the DUT 90.

The first transmitter 14 transmits the second signal $S_2$ generated by the second calculator 12 to a first receiver 82 of the handler 50. The first signal is a digital signal and is transmitted via, for example, an Inter-Integrated Circuit (I2C) bus although not particularly limited.

In contrast, the second transmitter 15 transmits the detection voltage signal of the temperature detection circuit 92 in the form of the analog signal to a second receiver 83 of the handler 50 as a third signal $S_3$.

Here, the junction temperature $T_j$ indicated by the second signal $S_2$ is the temperature of the DUT 90 which is highly accurately calculated by the second calculator 12. In contrast, the detection temperature ($T_j$+c) indicated by the third signal $S_3$ is the output itself of the temperature detection circuit 92 not subjected to a calculation such as correction. Since the presence or absence of such a correction process is different or the signal path distance is different, the detection temperature ($T_j$+c) indicated by the third signal $S_3$ includes an error c with respect to the junction temperature $T_j$ (see FIG. 2).

Further, in the embodiment, the second controller 17 is able to output a fourth signal $S_4$ to the third transmitter 16.

The fourth signal $S_4$ is a switching signal for switching a second switch 871 of a temperature controller 87 of the handler 50.

The fourth receiver 18 receives a start signal $S_{st}$ output from the handler 50 and outputs the start signal $S_{st}$ to the second controller 17. When the start signal $S_{st}$ is input to the second controller 17, the second controller 17 starts the test of the DUT 90 and switches the output destination of the first switch 11 to the second transmitter 15.

As illustrated in FIG. 1, the handler 50 of the embodiment includes a pusher 60, a temperature adjuster 70, and a control device 80. The pusher 60 presses the DUT 90 against the socket 20 and electrically connects the DUT 90 to the socket 20 in order to perform the test of the DUT 90. The temperature adjuster 70 adjusts the temperature of the DUT 90 by controlling the temperature of the pusher 60 using the refrigerant and the hot medium while the pusher 60 is in contact with the DUT 90 so as to transfer heat therebetween. The control device 80 calculates the temperature $T_j'$ of the DUT 90 by using the second and third signals $S_2$ and $S_3$ transmitted from the tester 10 and controls the temperature adjuster 70 on the basis of the calculation result $T_j'$.

The pusher 60 is a member that contacts the DUT 90 in a heat transfer manner when the handler 50 presses the DUT 90 against the socket 20. For this reason, the pusher 60 includes an internal space 61 to which the refrigerant and the hot medium are supplied from the temperature adjuster 70. Further, a temperature sensor 62 is buried in the pusher 60. A detection signal of the temperature sensor 62 is output to the temperature controller 87.

The temperature adjuster 70 includes a flow rate adjustment unit 71, a refrigerant supply unit 72, and a hot medium supply unit 73. The internal space 61 of the pusher 60 communicates with the refrigerant supply unit 72 and the hot medium supply unit 73 via the flow rate adjustment unit 71. Although particularly not illustrated in the drawings, the refrigerant supply unit 72 includes, for example, a circulation path for supplying a liquid refrigerant to the internal space 61 of the pusher 60 and collecting the refrigerant from the internal space 61 and also includes a pump and a chiller provided on the circulation path. Similarly, although particularly not illustrated in the drawings, the hot medium supply unit 73 includes, for example, a circulation path for supplying a liquid hot medium to the internal space 61 of the pusher 60 and collecting the hot medium from the internal space 61 and also includes a pump and a boiler provided on the circulation path.

The flow rate adjustment unit 71 can arbitrarily adjust the flow rate of the refrigerant supplied from the refrigerant supply unit 72 to the internal space 61 of the pusher 60 and the flow rate of the hot medium supplied from the hot medium supply unit 73 to the internal space 61 of the pusher 60 by opening and closing a valve 711. The valve 711 is connected to an actuator 712 such as a motor and rotates the valve 711 by the actuator 712 so as to open and close the valve 711. Then, the temperature of the DUT 90 can be adjusted when the control device 80 adjusts the flow rate of each of the refrigerant and the hot medium by driving the actuator 712 while the pusher 60 is in contact with the DUT 90.

As a detailed example of the temperature adjuster 70, for example, a device described in U.S. patent application Ser. No. 12/742,178 (US Patent Application Publication No. 2011/0126931) can be exemplified. Additionally, the configuration of the temperature adjuster is not particularly limited to the above-described one. For example, the flow rates of the refrigerant and the hot medium may be respectively adjusted by using solenoid valves instead of the valve 711 and the actuator 712. As a detailed example of the temperature adjuster with such a configuration, for example, a device described in U.S. patent application Ser. No. 14/472,398 (US Patent Application Publication No. 2015/0268295) can be exemplified. Alternatively, a thermostreamer or a heater using a gas as a refrigerant and a heating medium may also be used as the temperature adjuster.

As illustrated in FIG. 1, the control device 80 of the handler 50 includes a first receiver 82, a second receiver 83, a third receiver 84, a converter 85, a first calculator 86, a temperature controller 87, a first controller 88, and a fourth transmitter 89.

The first receiver 82 receives the second signal $S_2$ from the first transmitter 14 of the tester 10 and outputs the signal to the first calculator 86. The second receiver 83 receives the third signal $S_3$ from the second transmitter 15 of the tester 10 and outputs the signal to the converter 85. The converter 85 performs an AD converting process on the received third signal $S_3$ and outputs a digital signal subjected to the AD converting process to the first calculator 86. Additionally, the second calculator 12 of the tester 10 has a calculation function in addition to an AD converting function, but the converter 85 of the handler 50 only has a function of converting the third signal $S_3$ into a digital signal.

The first calculator 86 calculates a current temperature $T_j'$ of the DUT 90 (hereinafter, simply referred to as a "DUT temperature $T_j'$") according to the following mathematical formula (1) by using the second signal $S_2$ (the junction temperature $T_j$) input from the first receiver 82 and the third signal $S_3$ (the detection temperature $T_j+c$) input from the converter 85 (see FIG. 2). FIG. 2 is a diagram illustrating a method of calculating the DUT temperature $T_j'$ according to the following mathematical formula (1).

[Mathematical Formula 1]

$$\left. \begin{array}{l} T_j' = T_j + \sum \Delta T_j \\ \Delta T_j = (T_j + c) - z^{-1}(T_j + c) \end{array} \right\} \quad (1)$$

Here, in the above-described mathematical formula (1), $T_j$ indicates the junction temperature immediately before turning on the first switch 11, $(T_j+c)$ indicates the detection temperature sampled at the most recent time, $z^{-1}(T_j+c)$ indicates the detection temperature sampled before one time, and $\Sigma \Delta T_j$ indicates the total sum of $\Delta T_j$ calculated from the detection temperature sampled from the first time to the most recent time.

As illustrated in FIG. 1, the temperature controller 87 includes the second switch 871 and a third calculator 872.

One input terminal 871a of the second switch 871 is electrically connected to the first calculator 86. Then, an output terminal 871c of the second switch 871 is electrically connected to the third calculator 872. Additionally, as illustrated in FIG. 1, the temperature controller 87 may have a function of adding an arbitrary offset value $T_{j\_offset}$ to the DUT temperature $T_j'$ calculated by the first calculator 86.

When the input terminal 871a of the second switch 871 is electrically connected to the first calculator 86, the temperature controller 87 controls the temperature adjuster 70 while switching the first temperature control and the second temperature control.

The first temperature control is started when the start signal $S_{st}$ output from the first controller 88 of the handler 50 is input to the third calculator 872. Further, the first temperature control is temporarily stopped when the second temperature control is started, but the calculation of the DUT temperature $T_j'$ is continued. Then, when the second temperature control is ended, the first temperature control is resumed.

The start signal $S_{st}$ output from the first controller 88 is also a signal for starting the test of the DUT 90 and when the first controller 88 outputs the start signal $S_{st}$ to the tester 10 via the fourth transmitter 89, the test of the DUT 90 is started. Accordingly, the temperature adjuster 70 is controlled by the first temperature control immediately after the test of the DUT 90 is started.

In the first temperature control, the temperature of the DUT 90 is adjusted by the temperature adjuster 70 so that a difference between a set point $T_{SP}$ corresponding to a target temperature and the DUT temperature $T_j'$ calculated by the first calculator 86 becomes minimal by the third calculator 872 (hereinafter, simply referred to as a "$T_j'$ feedback control").

Specifically, the temperature adjuster 70 controls the actuator 712 of the flow rate adjustment unit 71 on the basis of the DUT temperature $T_j'$ calculated by the first calculator 86 and controls the temperature of the pusher 60 by adjusting the flow rates of the refrigerant and the hot medium flowing into the pusher 60. The temperature of the DUT 90 is adjusted in such a manner that the DUT 90 is heated or cooled by the heat transferred from the pusher 60. As a detailed control method which is performed by the third calculator 872, for example, a proportional-integral-differential (PID) control or the like can be exemplified.

Meanwhile, the second temperature control is started when the first signal $S_1$ transmitted from the first controller 88 is input to the third calculator 872. That is, the handler 50 adjusts the temperature of the DUT 90 while switching the first temperature control and the second temperature control by the first controller 88 during the test of the DUT 90.

The second temperature control is a control according to a method different from the first temperature control and is a temperature control which is forcedly started by temporarily stopping the first temperature control when the first signal $S_1$ is input to the third calculator 872 during the first temperature control. In the embodiment, the second temperature control controls the temperature adjuster 70 so as to forcedly start the rapid cooling or rapid heating of the DUT 90 regardless of the current temperature $T_j'$ of the DUT 90.

Here, a broken line of FIG. 3 indicates a DUT temperature profile $P_{temp}$ when a test is performed only using the first temperature control for the DUT that rapidly self-heats in a short time. When the DUT rapidly self-heats during the test, only in the first temperature control based on the current DUT temperature $T_j'$, the DUT temperature rapidly rises since the DUT temperature adjustment cannot cope with the rapid rising of the DUT temperature. That is, since the first temperature control cannot cope with the self-heating of the DUT, the DUT temperature overshoots the set point $T_{SP}$.

Meanwhile, since the tester 10 can previously acquire the temperature profile $P_{temp}$ (for example, a broken line of FIG. 3) indicating the behavior of the temperature of the DUT 90 in an actual test via the handler 50, it is possible to predict a temperature peak $T_{peak}$ at which the temperature of the DUT 90 under test rises in the same type of the DUT 90. Additionally, the tester 10 may acquire the temperature profile $P_{temp}$ of the DUT 90 in advance by a simulation or the like based on the design value of the DUT 90.

Here, in the embodiment, as illustrated in FIG. 3, the first controller 88 of the handler 50 outputs the first signal $S_1$ to the third calculator 872 so as to forcedly start the cooling of the DUT 90. Then, the third calculator 872 controls the temperature adjuster 70 so as to forcedly start the cooling of the DUT 90 at a timing faster than the timing at which the control based on the DUT temperature $T_j'$ starts the cooling on the basis of the first signal $S_1$ regardless of the current temperature $T_j'$ of the DUT 90. At this time, the temperature adjuster 70 cools the pusher 60 at a maximum output in order to cope with the rapid self-heating of the DUT 90 by forcedly starting the rapid cooling of the DUT 90 (hereinafter, simply referred to as a "forced cooling control").

Due to such a pre-trigger function, even in a type in which the DUT 90 rapidly self-heats in a short time, the temperature change of the DUT 90 can be suppressed as indicated by a solid line of FIG. 3 (that is, the temperature profile of the DUT 90 is changed to $P_{temp}'$) and the temperature of the DUT 90 can be appropriately adjusted.

In the embodiment, the second temperature control is started at a time point in which a first predetermined time $t_1$ is elapsed from the start of the test of the DUT 90. In other words, the first signal $S_1$ is input to the third calculator 872 at a time point in which the first predetermined time $t_1$ is elapsed from the start of the test of the DUT 90.

The first predetermined time $t_1$ is a value ($t_1 < t_{peak}$) which is smaller than a time $t_{peak}$ until reaching the temperature peak $T_{peak}$ from the start of the test of the DUT 90 and can be set on the basis of the time $t_{peak}$ and the heating amount of the temperature peak $T_{peak}$. Additionally, the temperature peak $T_{peak}$ indicates a point in which the temperature of the DUT 90 has changed from rising to falling in a convex shape with a slope that suddenly increases due to the self-heating of the DUT 90 in the temperature profile (that is, the self-heating amount per unit time of the DUT 90 exceeds the maximum cooling capacity per unit time of the temperature adjuster 70). The time $t_{peak}$ at this time can be obtained from a previously acquired temperature profile (indicated by a broken line of FIG. 3). Further, the heating amount of the temperature peak $T_{peak}$ can be obtained by the calculation from the value of $T_{peak}$ and the heat capacity of the DUT 90.

In consideration of the time $t_{peak}$ and the heating amount of the temperature peak $T_{peak}$, the cooling start time (the first predetermined time $t_1$) and the cooling continuation time suitable for a case of cooling the pusher 60 in a maximum output can be set.

Further, the temperature control response characteristics of the temperature adjuster 70 and the temperature control response characteristics of the DUT 90 are also used for setting the first predetermined time $t_1$. The temperature control response characteristics of the temperature adjuster 70 are parameters affecting the heat transfer of the temperature adjuster 70 and specifically correspond to the size and material of the pusher 60 and the type of the hot medium and the refrigerant. Further, the temperature control response characteristics of the DUT 90 are parameters affecting the heat transfer of the DUT 90 and specifically correspond to the type, size, and thickness of the DUT 90.

Since a delay time $t_{late}$ is caused until the temperature control of the temperature adjuster 70 is transmitted to the DUT 90 due to the temperature control response characteristics, it is desirable to start the second temperature control earlier by the delay time $t_{late}$. In addition, for example, when the time until the temperature change of the DUT 90 starts from the start of the cooling or heating of the DUT 90 by the temperature adjuster 70 is measured actually, the delay time $t_{late}$ can be measured.

As illustrated in FIG. 3, in the embodiment, the first predetermined time $t_1$ is set to a time earlier than the time $t_{peak}$ by $\Delta t$ seconds ($\Delta t = t_{peak} - t_1$) and the value of $\Delta t$ is calculated on the basis of the delay time $t_{late}$ and the heating amount at the temperature peak $T_{peak}$. Additionally, for example, when the temperature control response characteristics are excellent (that is, the time until the actual temperature change of the DUT 90 starts from the start of the cooling or heating of the DUT 90 by the temperature adjuster 70 is extremely short), the temperature control response characteristics of the temperature adjuster 70 or the temperature control characteristics of the DUT 90 may not be considered in the setting of the first predetermined time $t_1$.

Further, in the second temperature control of the embodiment, the temperature adjuster 70 is controlled so that the forced cooling of the DUT 90 is stopped and the forced heating of the DUT 90 is started after a second predetermined time $t_2$ is elapsed from the start of the second temperature control (the start of the forced cooling of the DUT 90). That is, as illustrated in FIG. 3, the forced cooling control of forcedly cooling the pusher 60 is stopped and the forced heating control of forcedly heating the pusher 60 (increasing the temperature of the pusher 60) is started.

Such forced heating control can suppress the undershoot of the temperature of the DUT 90 as will be described below. That is, as indicated by the broken line of FIG. 3, in the test only using the first temperature control, the cooling of the DUT in response to an increase in temperature is started after a rapid increase in temperature of the DUT. At this time, the cooling output of the temperature adjuster 70 may become unnecessarily large due to the large temperature rise of the DUT and the DUT temperature may abruptly decrease. That is, the DUT temperature may undershoot the set point $T_{SP}$.

Further, a one-dotted chain line of FIG. 3 indicates a DUT temperature profile $P_{temp}''$ when a test is performed by only using the first temperature control and the forced cooling control of the second temperature control in the DUT that rapidly self-heats in a short time. As indicated by the one-dotted chain line of FIG. 3, there is a case in which the DUT temperature falls too much due to the forced cooling control also in the test only using the first temperature control and the forced cooling control of the second temperature control (see a temperature $T_{valley}$ indicated by a one-dotted chain line of FIG. 3). That is, the DUT temperature may undershoot the set point $T_{SP}$.

In contrast, in the embodiment, as indicated by a solid line of FIG. 3, the undershoot of the temperature of the DUT 90 can be suppressed by the above-described forced heating control. When the undershoot is extremely small, the forced heating control may not be performed.

The second predetermined time $t_2$ can be set on the basis of the temperature profile $P_{temp}''$, the temperature control response characteristics of the temperature adjuster 70, and the temperature control response characteristics of the DUT 90. Since the second predetermined time $t_2$ is set to be earlier by a time $\Delta t'$ than the time reaching the temperature $T_{valley}$ of the temperature profile $P_{temp}''$ (a point in which the temperature of the DUT 90 changes to rise from the falling state) and the pusher 60 is heated to appropriately increase the temperature of the pusher 60, the temperature of the DUT 90 doesn't fall too much after self-heating. At this time, the second predetermined time $t_2$ is set in consideration of the delay time $t_{late}$ due to the temperature control response characteristics. The temperature control response characteristics of the temperature adjuster 70 and the temperature control response characteristics of the DUT 90 mentioned herein are the same as above. In addition, for example, when the temperature control response characteristics are excellent, the temperature control response characteristics of the temperature adjuster 70 or the temperature control characteristics of the DUT 90 may not be considered in the setting of the second predetermined time $t_2$.

Returning to FIG. 1, an input terminal 871b of the second switch 871 is electrically connected to the temperature sensor 62 provided in the pusher 60. The second switch 871 is connected to the third receiver 84 and is configured to selectively switch the input source of the third calculator 872 to the first calculator 86 or the temperature sensor 62 in accordance with the fourth signal $S_4$ from the tester 10. That is, the tester 10 can switch the temperature used in the temperature control of the temperature adjuster 70 between the DUT temperature $T_j'$ calculated by the first calculator 86 and the detection result $T_p$ detected by the temperature sensor 62 by switching the second switch 871.

In a normal test, since the temperature control of the DUT 90 is performed by using the DUT temperature $T_j'$ calculated by the first calculator 86, the second switch 871 connects the first calculator 86 to the third calculator 872.

In contrast, the detection voltage signal cannot be acquired from the temperature detection circuit 92 when diagnosing the temperature detection circuit 92 or diagnosing the contact between the DUT 90 and the socket 20. For that reason, the tester 10 outputs the fourth signal $S_4$ to the temperature controller 87 via the third transmitter 16 and the third receiver 84 when diagnosing the temperature detection circuit 92 or diagnosing the contact between the DUT 90 and the socket 20. The second switch 871 switches the input source of the temperature controller 87 to the temperature sensor 62 on the basis of the fourth signal $S_4$.

Further, the first calculator 86 cannot accurately calculate the DUT temperature $T_j'$ even when the junction temperature $T_j$ indicates an abnormal value. For that reason, when the junction temperature T detected by the temperature detection circuit 92 exceeds a threshold value, the tester 10 outputs the fourth signal $S_4$ to the temperature controller 87 and the second switch 871 switches the input source of the temperature controller 87 to the temperature sensor 62. Alternatively, when the DUT 90 does not rapidly self-heats, the tester 10 may output the fourth signal $S_4$ to the temperature controller 87 and the second switch 871 may switch the input source of the temperature controller 87 to the temperature sensor 62.

In addition, when the input source of the temperature controller 87 is switched to the temperature sensor 62 by the second switch 871, the third calculator 872 controls the temperature adjuster 70 so that a difference between the detection result Tp and the set point $T_{SP}$ of the temperature sensor 62 becomes minimal.

Hereinafter, the operation of the electronic component testing apparatus 1 of the embodiment will be described.

When the DUT 90 is placed on the socket 20 by the handler 50, the DUT 90 is pressed against the socket 20 by the pusher 60 so that the DUT 90 is electrically connected to the socket 20. Then, the tester 10 performs the test of the DUT 90.

The tester 10 switches the first switch 11 so that the socket 20 is connected to the second calculator 12 while the test of the DUT 90 is not performed (that is, a time between the tests). Accordingly, the detection voltage signal of the temperature detection circuit 92 is input to the second calculator 12.

In contrast, the tester 10 switches the first switch 11 so that the socket 20 is connected to the second transmitter 15 while the test of the DUT 90 is performed. Accordingly, the detection voltage signal of the temperature detection circuit 92 is input to the second transmitter 15.

The test time of the DUT 90 is longer than the time between the tests. For that reason, as illustrated in FIG. 2, a time $t_{on}$ in which the first switch 11 is turned on (that is, a time in which the third signal $S_3$ is transmitted from the tester 20) is longer than a time $t_{off}$ in which the first switch 11 is turned off (that is, a time in which the second signal $S_2$ is transmitted from the tester 20).

Returning to FIG. 1, the second calculator 12 generates the second signal $S_2$ (the junction temperature $T_j$) by performing an AD converting process on the detection voltage signal input via the socket 20 and the first switch 11 and performing a predetermined correction process on the detection voltage signal. The second signal $S_2$ is input to the first calculator 86 of the handler 50 via the first transmitter 14 and the first receiver 82.

Meanwhile, the detection voltage signal input to the second transmitter 15 via the socket 20 and the first switch 11 is input to the converter 85 via the second receiver 83 in the form of the analog signal. The converter 85 performs an AD converting process on the third signal $S_3$ and inputs the converted digital signal to the first calculator 86.

The first calculator 86 calculates the current DUT temperature $T_j'$ according to the above-described mathematical formula (1) when the third signal $S_3$ is input from the converter 85. In the embodiment, the second signal $S_2$ (the junction temperature $T_j$) is sequentially corrected by using the third signal $S_3$ (the detection temperature $T_j+c$) according to the above-described mathematical formula (1).

Here, since the test time of the DUT is longer than the time between the tests as described above, there is a case in which the DUT temperature cannot be measured although the DUT temperature largely changes under test, for example, in the graphics processing unit (GPU) or the like that rapidly self-heats.

In contrast, in the first temperature control of the embodiment, the DUT temperature $T_j'$ is calculated on the basis of the second signal $S_2$ by adding an accumulated error ($\Sigma\Delta T_j$) obtained in time series from the third signal $S_3$ (the detection temperature $T_j+c$) to the second signal $S_2$ (the junction temperature $T_j$) as illustrated in FIG. 2. Accordingly, the temperature $T_j'$ of the DUT 90 can be recognized in real time with high accuracy as indicated by a solid line of FIG. 2.

Additionally, the first calculator 86 calculates the above-described mathematical formula (1) after initializing the accumulated error ($\Sigma\Delta T_j$) while setting the junction temperature $T_j$ in the above-described mathematical formula (1) again when the second signal $S_2$ is input from the second calculator 12 (that is, the junction temperature $T_j$ is calculated by the first calculator 12).

Further, in the first temperature control, the first calculator 86 may calculate the DUT temperature $T_j'$ according to the following mathematical formula (2) instead of the above-described mathematical formula (1). In this modified example, the third signal $S_3$ (the detection temperature $T_j+c$) is sequentially corrected by using the second signal $S_2$ (the junction temperature $T_j$) according to the following mathematical formula (2). Additionally, FIG. 4 is a diagram illustrating a method of calculating the DUT temperature $T_j'$ according to the following mathematical formula (2).

[Mathematical Formula 2]

$$T_j' = (T_j+c) + \{T_j - z^{-k}(T_j+c)\} \qquad (2)$$

Here, in the above-described mathematical formula (2), $(T_j+c)$ indicates the detection temperature sampled at the most recent time, $T_j$ indicates the junction temperature immediately before the first switch 11 is turned on, and $z^{-k}(T_j+c)$ indicates the detection temperature sampled immediately after the first switch 11 is turned on.

In the case of this example, as illustrated in FIG. 4, the DUT temperature $T_j'$ is calculated on the basis of the third signal $S_3$ by calculating a difference between the second signal $S_2$ (the junction temperature $T_j$) immediately before turning on the first switch 11 and the third signal $S_3$ ($z^{-k}(T_j+c)$) immediately after turning on the first switch 11 and adding the difference to the most recent third signal $S_3$ (the detection temperature $T_j+c$). Accordingly, the temperature $T_j'$ of the DUT 90 can be recognized in most real time with high accuracy as indicated by a solid line of FIG. 4.

Further, as described above, when the DUT 90 rapidly self-heats, there is a case in which the first temperature control cannot follow the rapid temperature change of the DUT 90. In contrast, in the embodiment, an increase in temperature of the DUT 90 due to the self-heating is predicted on the basis of the previously acquired temperature profile $P_{temp}$ (see FIG. 3) and the second temperature control of forcedly cooling the DUT 90 is performed. Then, the stopped first control is resumed after the second control ends.

As described above, in the embodiment, since the second temperature control different from the first temperature control is performed on the temperature change of the DUT 90 which cannot be handled only by the first temperature control based on the DUT temperature $T_j'$, the temperature can be controlled within an appropriate range even in the DUT 90 in which a rapid temperature change is generated under test.

The above-described embodiment is used to facilitate the understanding of the invention and is not described to limit the invention. Therefore, each component disclosed in the above-described embodiment is intended to include all design changes and equivalents belonging to the technical scope of the invention.

For example, when a temperature profile in which the temperature of the DUT 90 rapidly falls in a short time can be obtained in the test only using the first temperature control, the temperature adjuster 70 may be controlled so as to forcedly heat the DUT 90 in the second control. In this case, the control of the temperature adjuster 70 may be started such that the DUT 90 is forcedly heated after the control of the temperature adjuster 70 forcedly heating the DUT 90 is stopped in the second control.

EXPLANATIONS OF LETTERS OR NUMERALS

1 ELECTRONIC COMPONENT TESTING APPARATUS
10 TESTER
11 FIRST SWITCH
11a INPUT TERMINAL
11b, 11c OUTPUT TERMINAL
12 SECOND CALCULATOR
14 TO 16 FIRST TO THIRD TRANSMITTERS
17 SECOND CONTROLLER
18 FOURTH RECEIVER
20 SOCKET
21 CONTACT
30 CABLE
50 HANDLER
60 PUSHER

61 INTERNAL SPACE
62 TEMPERATURE SENSOR
70 TEMPERATURE ADJUSTER
71 FLOW RATE ADJUSTMENT UNIT
711 VALVE
712 ACTUATOR
72 REFRIGERANT SUPPLY UNIT
73 HOT MEDIUM SUPPLY UNIT
80 CONTROL DEVICE
82 TO 84 FIRST TO THIRD RECEIVERS
85 CONVERTER
86 FIRST CALCULATOR
87 TEMPERATURE CONTROLLER
871 SECOND SWITCH
871a, 871b INPUT TERMINAL
871c OUTPUT TERMINAL
872 THIRD CALCULATOR
88 FIRST CONTROLLER
89 FOURTH TRANSMITTER
90 DUT
91 MAIN CIRCUIT
92 TEMPERATURE DETECTION CIRCUIT
93 INPUT/OUTPUT TERMINAL

The invention claimed is:

1. An electronic component handling apparatus for handling a device under test (DUT) and pressing the DUT against a socket electrically connected to a tester testing the DUT, comprising:
   a temperature adjuster adjusting a temperature of the DUT;
   a first calculator calculating the temperature of the DUT based on a detection result of a temperature detection circuit disposed in the DUT;
   a temperature controller controlling the temperature adjuster; and
   a first controller outputting a first signal to the temperature controller,
   wherein a temperature control performed by the temperature controller includes a first temperature control based on the temperature of the DUT calculated by the first calculator and a second temperature control different from the first temperature control,
   wherein when the first signal is input from the first controller to the temperature controller after the temperature controller starts the first temperature control, the temperature controller switches the temperature control of the DUT from the first temperature control to the second temperature control,
   wherein the first signal is input to the temperature controller after a first predetermined time is elapsed from the start of the first temperature control,
   wherein the first predetermined time is set based on a previously measured temperature profile,
   wherein the previously measured temperature profile is a profile indicating a behavior of the temperature of the DUT tested by the tester while the temperature is adjusted by the first temperature control, and
   wherein the first predetermined time is set based on an elapsed time from a start of the testing of the DUT to a temperature peak in the previously measured temperature profile and a heating value at the temperature peak.

2. An electronic component handling apparatus for handling a device under test (DUT) and pressing the DUT against a socket electrically connected to a tester testing the DUT, comprising:
   a temperature adjuster adjusting a temperature of the DUT;
   a first calculator calculating the temperature of the DUT based on a detection result of a temperature detection circuit disposed in the DUT;
   a temperature controller controlling the temperature adjuster; and
   a first controller outputting a first signal to the temperature controller,
   wherein a temperature control performed by the temperature controller includes a first temperature control based on the temperature of the DUT calculated by the first calculator and a second temperature control different from the first temperature control,
   wherein when the first signal is input from the first controller to the temperature controller after the temperature controller starts the first temperature control, the temperature controller switches the temperature control of the DUT from the first temperature control to the second temperature control,
   wherein the first signal is input to the temperature controller after a first predetermined time is elapsed from the start of the first temperature control,
   wherein the first predetermined time is set based on a previously measured temperature profile,
   wherein the previously measured temperature profile is a profile indicating a behavior of the temperature of the DUT tested by the tester while the temperature is adjusted by the first temperature control, and
   wherein the first predetermined time is set based on temperature control response characteristics of the temperature adjuster and temperature control response characteristics of the DUT in addition to the previously measured temperature profile.

3. An electronic component handling apparatus for handling a device under test (DUT) and pressing the DUT against a socket electrically connected to a tester testing the DUT, comprising:
   a temperature adjuster adjusting a temperature of the DUT;
   a first calculator calculating the temperature of the DUT based on a detection result of a temperature detection circuit disposed in the DUT;
   a temperature controller controlling the temperature adjuster; and
   a first controller outputting a first signal to the temperature controller,
   wherein a temperature control performed by the temperature controller includes a first temperature control based on the temperature of the DUT calculated by the first calculator and a second temperature control different from the first temperature control,
   wherein when the first signal is input from the first controller to the temperature controller after the temperature controller starts the first temperature control, the temperature controller switches the temperature control of the DUT from the first temperature control to the second temperature control,
   wherein the first signal is input to the temperature controller after a first predetermined time is elapsed from the start of the first temperature control, and
   wherein the second temperature control includes controlling the temperature adjuster so that cooling or heating of the DUT is forced to start based on the first signal and the cooling or heating of the DUT is stopped after a second predetermined time is elapsed from a start time of the second temperature control and then the heating or cooling of the DUT is started.

4. An electronic component testing apparatus comprising: the electronic component handling apparatus according to claim 3; and the tester electrically connected to the socket for testing the DUT, wherein the tester includes: a second calculator calculating a junction temperature of the DUT from a detection value of the temperature detection circuit; a first transmitter transmitting a calculation result of the second calculator as a second signal; and a second transmitter transmitting the detection value of the temperature detection circuit as a third signal.

\* \* \* \* \*